United States Patent
Bhat et al.

(10) Patent No.: US 10,484,136 B2
(45) Date of Patent: Nov. 19, 2019

(54) HIGH SPEED INTERLEAVER/DEINTERLEAVER DEVICE SUPPORTING LINE RATE, AND METHOD THEREOF

(71) Applicants: Sri Bhat, Boyds, MD (US); Bala Subramaniam, Potomac, MD (US); Yanlai Liu, Rockville, MD (US)

(72) Inventors: Sri Bhat, Boyds, MD (US); Bala Subramaniam, Potomac, MD (US); Yanlai Liu, Rockville, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 101 days.

(21) Appl. No.: 15/615,358

(22) Filed: Jun. 6, 2017

(65) Prior Publication Data

US 2018/0351701 A1  Dec. 6, 2018

(51) Int. Cl.
| | |
|---|---|
| H04L 1/00 | (2006.01) |
| G06F 12/06 | (2006.01) |
| G11C 7/10 | (2006.01) |
| G11C 7/18 | (2006.01) |
| H04L 27/20 | (2006.01) |

(52) U.S. Cl.
CPC ........ H04L 1/0071 (2013.01); G06F 12/0607 (2013.01); G11C 7/1042 (2013.01); G11C 7/18 (2013.01); H04L 27/20 (2013.01)

(58) Field of Classification Search
CPC ......... H04L 1/0071; H04L 27/20; G11C 7/18; G11C 7/1042; G06F 12/0607

USPC .......................................................... 375/340
See application file for complete search history.

(56) References Cited

U.S. PATENT DOCUMENTS 5,430,767 A * 7/1995 Min ...................... H03M 13/00
                                                           375/340
6,064,664 A * 5/2000 Kim .................. H03M 13/2764
                                                           370/320

(Continued)

OTHER PUBLICATIONS

Etsi: "Digital Video Broadcasting (DUB); Implementation guidelines for a second generation digital terrestrial television broadcasting system (DUB-T2); TS 102 831 v1.2.1", Aug. 1, 2012 (Aug. 1, 2012), pp. 157-173, XP055254158, Retrieved from the Internet: URL:https://www.etsi.org/deliver/etsi is/1 02800 102899/102831/01.02.01 60/ts 10831v01020lp.pdf [retrieved on Sep. 13, 2018].

(Continued)

*Primary Examiner* — Juan A Torres
(74) *Attorney, Agent, or Firm* — Capitol City Techlaw; Jasbir Singh

(57) ABSTRACT

A deinterleaver device, a method for deinterleaving, an interleaver device, and a method for interleaving are provided. The method for deinterleaving includes: providing a memory and a stream count for a frame; virtually dividing the memory into equal sections, wherein a section count equals the stream count; calculating a write address for a sample of the samples based on a location of the sample in the frame and a correspondence of the location to one of the sections; receiving the sample; and writing the received sample to the write address, wherein the calculating and the write address corresponds to a correct deinterleaving location in one of the sections for the sample.

14 Claims, 5 Drawing Sheets

(56) References Cited

U.S. PATENT DOCUMENTS

| | | | | |
|---|---|---|---|---|
| 6,192,493 B1* | 2/2001 | Combelles | ........ | H03M 13/2785 714/701 |
| 6,564,343 B1* | 5/2003 | Yamashita | ........ | H03M 13/2703 714/701 |
| 7,835,263 B2* | 11/2010 | Ochiai | .................. | H04L 1/0071 370/204 |
| 2004/0260892 A1* | 12/2004 | Chang | ............... | H03M 13/2703 711/157 |
| 2010/0146229 A1* | 6/2010 | Yang | .................. | G06F 12/0207 711/157 |
| 2011/0113305 A1* | 5/2011 | Liu | .................. | H03M 13/2707 714/773 |

OTHER PUBLICATIONS

International Search Report for corresponding PCT Application No. PCT/US2018/035802.

Zafar Iqbal et al: "Analysis and designof coding and interleaving in a MIMO-OFDM communication system", IEEE Transactions on Consumer Electronics,IEEE Service Center, New York, NY, US, vol. 58, No. 3, Aug. 1, 2012 (Aug. 1, 2012), pp. 758-766, XP011465088, ISSN: 0098-3063, DOI: 10.1109/TCE.2012.6311315.

* cited by examiner

| | Samples coming in this order at each cycle – clk1: SD0, SD21600, SD43200 clk2: SD1, SD21602, SD43202 clk3: SD2, SD21603, SD43203 ... | | |
|---|---|---|---|
| Row | Columns 0 – 39 | Columns 40 – 79 | Columns 80 - 119 |
| 0 | SD00 – SD39 | SD21600 – SD21639 | SD43200 – SD43239 |
| 1 | SD40 – SD79 | SD21640 – SD21679 | SD43240 – SD43279 |
| | | | |
| | | | |
| 539 | SD21560 - SD21599 | SD43160 - SD43199 | SD64760 - SD64799 |

| | Samples coming in this order at each cycle – clk1: SD0, SD15950, SD31900, SD47850 clk2: SD1, SD15951, SD31901, SD47851 clk3: SD2, SD15952, SD31902, SD47852 ... | | | |
|---|---|---|---|---|
| Row | Columns 0 – 29 | Columns 30 - 59 | Columns 60 - 89 | Columns 90 - 119 |
| 0 | SD00 – SD29 | SD15950 – SD15979 | SD31900 – SD31929 | SD47850 – SD47879 |
| 1 | SD30 – SD59 | SD21640 – SD21669 | SD31930 – SD31959 | SD47880 – SD47909 |
| | | | | |
| | | | | |
| 539 | SD15920– SD15949 | SD43160 - SD43199 | SD47920 – SD47849 | SD64780 - SD64799 |

FIG. 4

| | Samples coming in this order at each cycle – clk1: SD0, SD12960, SD25920, SD38880, SD51840 clk2: SD1, SD12961, SD25921, SD38881, SD51841 clk3: SD2, SD12962, SD25922, SD38882, SD51842 ... | | | | |
|---|---|---|---|---|---|
| Row | Columns 0 – 23 | Columns 24 - 47 | Columns 48 - 71 | Columns 72- 95 | Columns 96 - 119 |
| 0 | SD00 – SD23 | SD12960 – SD12983 | SD25920 – SD25943 | SD38880 – SD38903 | SD51840 – SD51863 |
| 1 | SD24 – SD47 | SD12984 – SD13007 | SD25944 – SD25967 | SD38904 – SD38927 | SD51864 – SD51887 |
| | | | | | |
| | | | | | |
| 539 | SD12936– SD12959 | SD25896 – SD25919 | SD38856 – SD38879 | SD51816 – SD51839 | SD64776 - SD64799 |

FIG. 5

HIGH SPEED INTERLEAVER/DEINTERLEAVER DEVICE SUPPORTING LINE RATE, AND METHOD THEREOF

FIELD

The present teachings disclose a high-speed interleaver device and a high-speed deinterleaver device operating at a line rate in a wireless communications system, and more particularly in a satellite communications system. In particular, the interleaver and deinterleaver devices can operate without latency while supporting various modulation schemes. In some embodiments, the line rate can be 3.8 Giga Bits per Second (Gbps) or above.

BACKGROUND

In the prior art, an ASIC (application-specific integrated circuit) implemented a deinterleaving operation using multiple Random Access Memories (RAMs) and two parallel deinterleaving chains to keep up with the throughput. Within each of these deinterleaver chains, the received data was first stored into an input RAM in the order it was received. The received data was then read out 1-bit per clock cycle and written into an output RAM at a correct deinterleaved location. The read operation took 64,800 cycles for a 64,800-bit frame regardless of the type of modulation. This required multiple input and output RAMs to buffer the data to keep up with the throughput. The multiple reading and writing operations also introduced latency in the system.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

The present teachings disclose a deinterleaver operating at a line rate that can be implemented with reduced memory and less hardware. The deinterleaver can operate without latency while supporting various modulation schemes.

A method for deinterleaving samples is disclosed. The method includes: providing a memory and a stream count for a frame; virtually dividing the memory into equal sections, wherein a section count equals the stream count; calculating a write address for a sample of the samples based on a location of the sample in the frame and a correspondence of the location to one of the sections; receiving the sample; and writing the received sample to the write address, wherein the calculating and the write address corresponds to a correct deinterleaving location in one of the sections for the sample.

A deinterleaver device to deinterleave a frame including samples is disclosed. The deinterleaver device includes: a memory; a memory initializer to virtually divide the memory into equal sections, wherein a section count equals a stream count of the frame; an address calculator to calculate a write address for a sample of the samples based on a location of the sample in the frame and a correspondence of the location to one of the sections; and a deinterleaver to receive the sample from the frame, and to write the received sample to the write address, wherein the write address corresponds to a correct deinterleaving location in one of the sections for the sample.

A method for interleaving samples is disclosed. The method includes: providing a memory and a stream count for a frame; dividing the memory into x-rows and y-columns, wherein y is calculated as a common denominator of a majority of the n-different counts, x is at least a length of samples divided by y, and the y-columns are subdivided into equal sections wherein a section count equals the stream count; collecting samples sequentially, wherein the collected samples number less than or equal to a section size of one of the sections; calculating a write address for the collected samples based on a location of the collected samples and the stream count; and writing the collected samples to the write address. In the method, the write address corresponds to a correct deinterleaving location in one of the sections for the samples.

An interleaver device to interleave a frame including samples is disclosed. The device includes: a memory; a memory initializer to divide the memory into x-rows and y-columns, wherein y is calculated as a common denominator of a majority of n-different supported stream counts, x is at least a length of samples divided by y, and the y-columns are subdivided into equal sections wherein a section count equals the stream count; an address calculator to calculate a write address based on a location of the collected samples and the stream count; and an interleaver to collect samples sequentially and to write the collected samples to the write address, wherein the collected samples number less than or equal to a section size of one of the sections. In the device, the write address corresponds to a correct deinterleaving location in one of the sections for the samples.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be considered to be limiting of its scope, implementations will be described and explained with additional specificity and detail through the use of the accompanying drawings.

FIG. 4 illustrates a de-interleaving operation for a 16-PSK modulated frame where the RAM is divided into 540-rows×120-columns, according to various embodiments.

FIG. 5 illustrates a de-interleaving operation for a 32-PSK modulated frame where the RAM is divided into 540-rows×120-columns, according to various embodiments.

Figure 1:
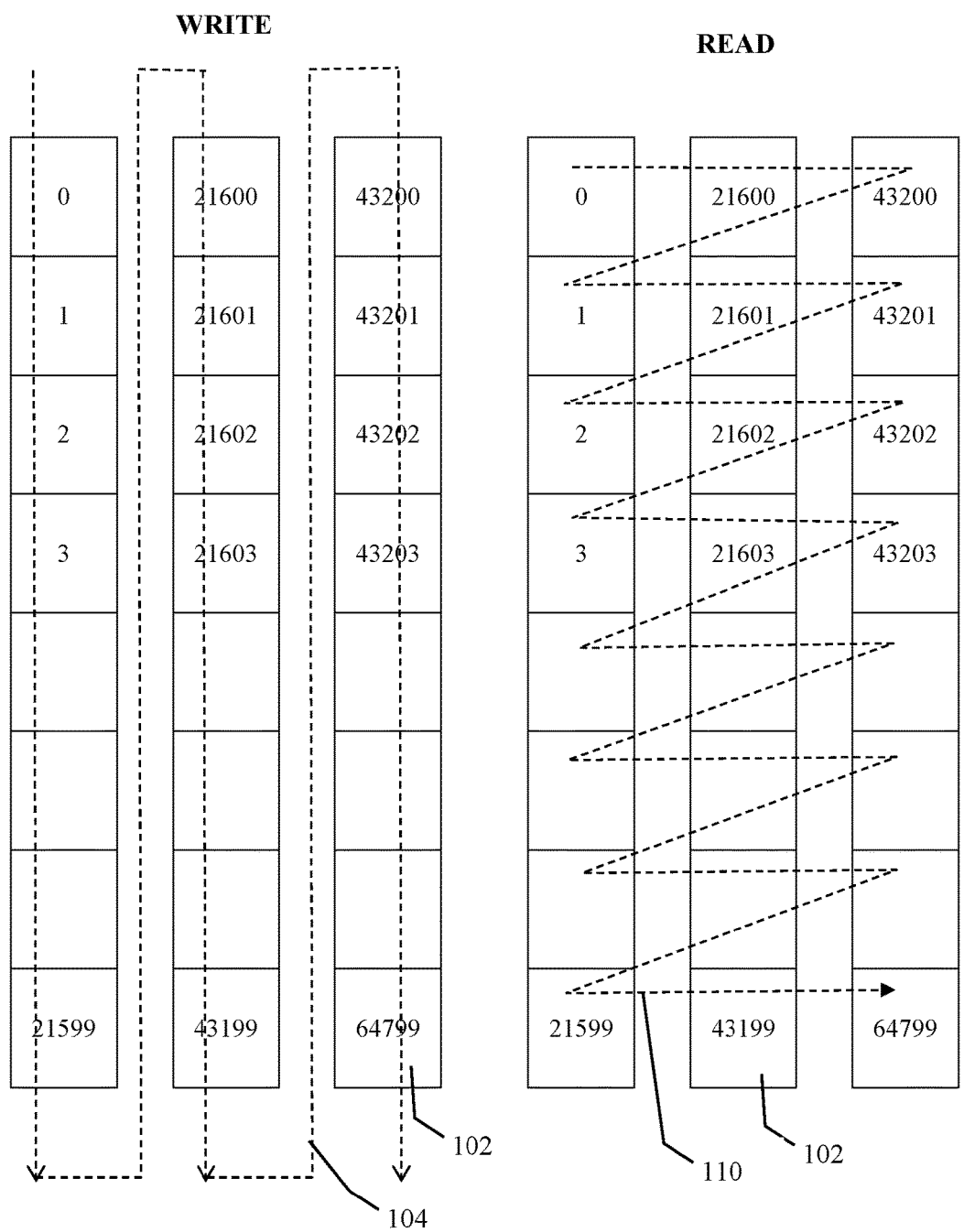
FIG. 1 illustrates how data is interleaved according to various embodiments.

In exemplary embodiments, a sample may comprise a soft decision, user data, bits, bytes, words, longwords or the like.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

The terminology used herein is for describing particular embodiments only and is not intended to be limiting of the present disclosure. As used herein, the singular forms "a," "an" and "the" are intended to include the plural forms as well, unless the context clearly indicates otherwise. Furthermore, the use of the terms a, an, etc. does not denote a limitation of quantity but rather denotes the presence of at least one of the referenced item. The use of the terms "first," "second," and the like does not imply any particular order, but they are included to either identify individual elements or to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

FIG. 1 illustrates how data is interleaved according to various embodiments.

FIG. 1 illustrates how data is interleaved, for example, at a transmitter, for an exemplary 3-stream modulation, in particular, per the 8-PSK modulation scheme. As shown, data is written column-wise into a memory or transmission buffer 102 sequentially from location 0, 1, 2, . . . to 64,799 as indicated by an arrow 104. In this example, the memory 102 is sized for transmitting 64K (64,800) units of data. The memory 102 may be divided into three equal columns, wherein each column maps to one stream of a three stream modulation, for example, 8-PSK (Phase Key Shifting). In exemplary embodiments, stream 0 may be written into locations 0 to 21599, stream 1 may be written into locations 21600 to 43199, and 43200-64799.

At transmission, the transmission buffer 102 is read-out row-wise, i.e., from location 0, 21600, 43200, 1, 21601, 43201, . . . to 64799 as indicated by arrow 110. The row-wise transmission interleaves the data. A receiver in a communications system is used to deinterleave the data in order to place the data in a correct order.

Figures 2, 3:
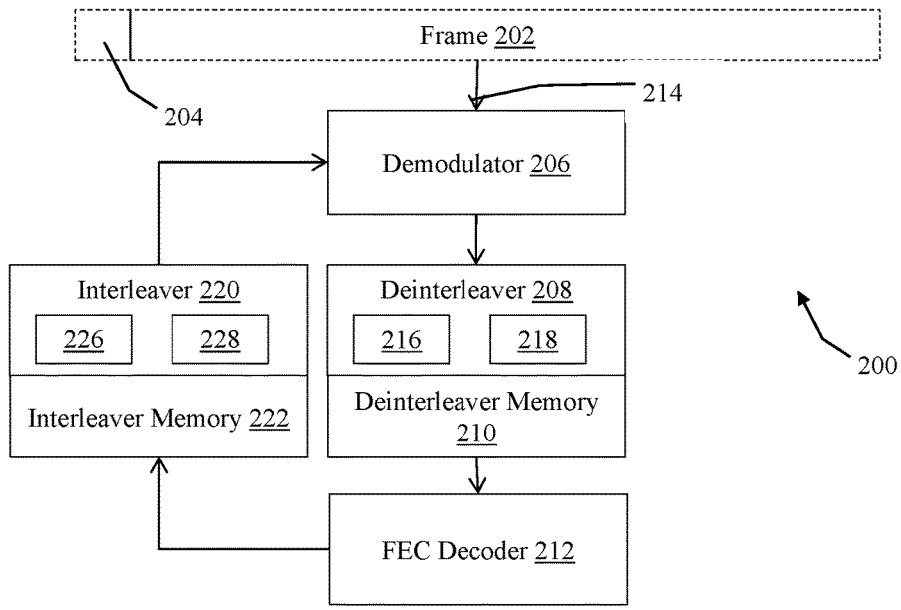
FIG. 2 illustrates an exemplary communications system including an interleaver device and a deinterleaver device according to various embodiments.
FIG. 3 illustrates a de-interleaving operation for an 8-PSK modulated frame where the RAM is divided into 540-rows×120-columns, according to various embodiments.

FIG. 2 illustrates an exemplary communications system including an interleaver device and a deinterleaver device according to various embodiments.

A communications system 200 may include a demodulator 206, an interleaver device 220, a deinterleaver device 208 and a decoder 212. The communications system 200 may receive a frame 202 of data and a frame header 204 via an incoming line 214. The incoming line 214 may be connected, for example, to an antenna (not shown). The frame header 204 may include a modulation-type, a length of the frame, and the like. In some embodiments, the frame header 204 may be modulated using a predetermined modulation scheme. The demodulator 206 may demodulate the frame header 204 per the predetermined scheme, and send a receive frame arrival signal and one or more of the parameters from the frame header 204 to the deinterleaver 208. The receive frame signal may include the modulation-type per the frame header 204.

The demodulator 206 may convert the signal (symbol) received over the line 214 into a sequence of Soft Decisions (SDs) based on parameters included in the frame header 204. The demodulator 206 forwards the SDs in the frame 202 to the deinterleaver 208 as the SDs are received on line 214.

After receiving the frame arrival signal, the deinterleaver device 208 may include a deinterleaver memory 210, a memory initializer 216 and an address calculator 218. The deinterleaver device 208 may be implemented as an ASIC (Application-Specific Integrated Circuit), an FPGA (Field Programmable Gate Array), or the like. The memory initializer 216 may select a memory bank in the deinterleaver memory 210 to which the SDs in the frame 202 will be written to, and to optionally initialize the memory bank. In some embodiments, after receiving the frame arrival signal, the deinterleaver 208 initializes an address calculator 218 to use the selected memory bank in the deinterleaver memory 210. After initializing and till the end of frame 202, the deinterleaver 208 receives an SD from the demodulator 206, determines the write address for the SD with the address calculator 218 and writes the SD into the calculated address. At the end of frame 202, the deinterleaver 208 sends a decode frame signal and one or more of the parameters from the frame header 204 to the decoder 212. In exemplary embodiments, the decoder 212 is a Forward Error Correcting (FEC) decoder.

In the present teachings, as the deinterleaver 208 places data in the appropriate deinterleaved location into the deinterleaver memory 210 as the data is being received. As such, when the data is read out, the data has already been deinterleaved and can be read out sequentially. Placing the data in the correct location as it is received results in a high-throughput operation operating at line-rate while providing no latency that needs less memory and hardware.

Based on the type of modulation on the incoming line 214, a different number of soft-decision streams arrive at the input to the deinterleaver 208. For example, there are 3 soft-decision samples per symbol for 8-PSK modulation, so 3 streams of data arrive. Similarly, for a 16-PSK modulated frame, there are 4 soft-decision samples per symbol so 4 streams arrive. Likewise, 5 streams for a 32-PSK frame, 6 streams for a 64-PSK frame and so on. Based on the modulation type of the received frame, the RAM is virtually divided into an appropriate number of sections. For example, the RAM may be divided into as many sections as there are streams in the modulated frame, i.e., three sections for an 8-PSK modulated frame, four sections for a 16-APSK modulated frame, five sections for a 32-APSK modulated frame, and so on.

In exemplary embodiments, the deinterleaver memory 210 may include Random Access Memory (RAM). In exemplary embodiments, the RAM may be a single-port fixed size RAM that can hold, for example, one frame worth of soft-decision data. In exemplary embodiments, each frame may include 64,800 (64K) soft decisions. In exemplary embodiments, each soft decision may be 1-bit or more in length, for example, 6-bits in length, 7-bits in length, or 8-bits in length.

In exemplary embodiments, the RAM is treated as a serially addressable memory, for example, from 0 to 64799, with each writable location in the serially addressable memory being a fixed size or width, for example, 6-bits, 8-bits, or the like.

In exemplary embodiments, a high-throughput interleaver 220 may be using a reduced latency to work with the deinterleaver 208. In exemplary embodiments, a reduced latency of the interleaver 220 and the de-interleaver 208 enable more iterations of the demodulator 206 and/or the decoder 212 in order to improve the performance of the system 200.

In exemplary embodiments, the interleaver 220 may be a mirror of the deinterleaver 208. The interleaver 220 may select to receive samples (samples used to form a frame), for example, from the output of the decoder 212. In exemplary embodiments, the interleaver 220 may be provided the data to be interleaved in a buffer/memory. In exemplary embodiments, the interleaver 220 may be used as an iterative interleaver. To interleave the data, the interleaver 220 writes the data sequentially in the virtually divided sections in the interleaver memory 222. In exemplary embodiments, the interleaver 220 may divide the interleaver memory 222 into x-rows by y-columns, and the y-columns may be further sections with each section containing y-columns divided by a stream count, see, for example, FIG. 3, FIG. 4, FIG. 5. For example, the interleaver memory 222 may be large enough to store 64,800 samples and be divided into 540-rows by 120-columns. For a stream count of 3, the 120-columns are divided into 3 sections with each section including 40 columns. The interleaver 220 may collect a section's worth of data and write it to the interleaver memory 222. When a read is requested by a reader (such as, the deinterleaver 208 or a modulator/transmitter (not shown)) from the interleaver 220, the interleaver 220 may use an address calculator 228 to calculate a read address to retrieve the sample from a correct interleaving location based on a sample counter and the stream count (based on the modulation of the samples). In exemplary embodiments, the read address calculation, reading and sending of data to the reader may be performed by the interleaver 220 during one clock cycle of the line to maintain operating at line rate. A memory initializer 226 may select a memory bank in the interleaver memory 222 to which the samples/SDs for the frame 202 will be written to, and to optionally initialize the interleaver memory bank 222.

Exemplary Embodiment

In exemplary embodiments, the RAM is sized as 540-rows×120-columns regardless of the modulation. The 120 columns are then subdivided into one or more sections, where the number of sections is determined by the number of streams in the modulation. For example, the 120 columns may be divided into three sections of 40 writable locations in each section. In exemplary embodiments, each writable location may be a fixed size or width, for example, 6-bits, 8-bits, or the like.

The 540-rows×120-columns is based on the frame size being 64800 (540×120=64800).

The number of columns (120) is based on a common denominator of the number of streams by various modulations in the system. Here, for example, the system may provide support for modulations that utilize 1, 2, 3, 4, 5, or 6 streams (120 being a common denominator); other common denominators being for 1, 2, 3, 4, 5, or 6 streams are 60, 180, or the like. The 540×120 virtual division of memory may also support 8 streams (used by, for example, 256-PSK modulation) as 120 is a common denominator of 1, 2, 3, 4, 5, 6 and 8. In exemplary embodiments, the common denominator is a least common denominator.

In exemplary embodiments, the 540×120 division of memory, physical or virtual, may also support 7 streams (used by, for example, 128-PSK modulation) even though 120 is not a common denominator of 1, 2, 3, 4, 5, 6 and 7. In exemplary embodiments, the address calculator may provide only use the 119 columns of the 120 columns in memory (119 being a multiple of 7) and 545 rows rather than the 540 rows for other stream counts.

The number of rows (540) is based on dividing the frame size by the number of columns.

The number of sections distributed over the columns is based on the modulation. As such, the number of columns and sections that the RAM is virtually divided into can be extended to any type of modulation and frame-size.

FIG. 3 illustrates a de-interleaving operation for an 8-PSK modulated frame where the RAM is divided into 540-rows× 120-columns, according to various embodiments.

SDs may be stored into the RAM into the correct deinterleaved location on the communications system 200 of FIG. 2. As the frame being deinterleaved is an 8-PSK modulated frame and as such includes three streams, the RAM is virtually divided into 3 sections, i.e., one section per each incoming stream. Thus, each section is 40 columns wide. The samples may be received in the following order at each cycle by a deinterleaver, for example, the deinterleaver 208 of FIG. 2; similarly, when servicing a read request the interleaver (for example, the interleaver 220 of FIG. 2) may retrieve samples from the RAM in the same order as the deinterleaver receives them and sends the retrieved samples to the reader:

clk1: SD0, SD21600, SD43200
clk2: SD1, SD21602, SD43202
clk3: SD2, SD21603, SD43203
etc.

As can be seen in FIG. 3, the first set of 3 soft decisions (SDs) received (0, 21600, 43200 bits) are populated into the first column of each of these virtual sections in row 0; the second set of SDs (1,21601, 43201) is written into columns 1, 41 and 81 of row 0; and so on. Moreover, in exemplary embodiments, three samples are received in one clock tick, and these received samples are written into the deinterleaver RAM in one go. Hence the data is being deinterleaved during the writing process, for example, by the deinterleaver 208 of FIG. 2. On a read, the data is serially read per section, for example, by the decoder 212 of FIG. 2. In exemplary embodiments, during a read, row 0 is read from columns 0 to 39 based on the input width required by the decoder; then row 1 is read from columns 0 to 39 & so on, i.e., each virtual section of RAM is read serially.

When receiving samples, the interleaver uses the modulation type information to save the samples in the interleaver memory within the correct section and write location therein. In this example, the frame being interleaved is an 8-PSK modulated frame and as such includes three streams. The interleaver, for example, the interleaver 220 FIG. 2, recognizes that the RAM is virtually divided into 3 sections, i.e., one section per each incoming stream, that each section is 40 columns wide, and that the samples are stored by sections. Thus, the interleaver, for example, the interleaver 220 of FIG. 2, receives the samples necessary to populate a section in a row in the following order at each cycle and does a write of the received samples as follows:

Clk1: SD00 to SD39 (Row0 in virtual section 1)
Clk2: SD40 to SD79 (Row1 in virtual section 1)
Clk3: SD80 to SD119 (Row2 in virtual section 1)
etc.

FIG. 4 illustrates a de-interleaving operation for a 16-PSK modulated frame where the RAM is divided into 540-rows×120-columns, according to various embodiments.

SDs may be stored into the RAM into the correct deinterleaved location on the communications system 200 of FIG. 2. As the frame being deinterleaved is a 16-PSK modulated frame and as such includes four streams, the RAM is virtually divided into 4 sections, i.e., one section per each incoming stream. Thus, each section is 30 columns wide. The samples may be received in the following order at each cycle by a deinterleaver, for example, the deinterleaver 208 of FIG. 2; similarly, when servicing a read request the interleaver (for example, the interleaver 220 of FIG. 2) may retrieve samples from the RAM in the same order as the deinterleaver receives them and sends the retrieved samples to the reader:

clk1: SD0, SD15950, SD31900, SD47850
clk2: SD1, SD15951, SD31901, SD47851
clk3: SD2, SD15952, SD31902, SD47852
etc.

As can be seen in FIG. 4, the first set of 4 soft decisions (SDs) received (0, 15950, 31900, 47850 bits) are populated into the first column of each of these virtual sections in row 0; the second set of SDs (1, 15951, 31901, 47851) is written into columns 1, 31, 61 and 91 of row 0; and so on. Moreover, in exemplary embodiments, four samples are received in one clock tick, and these received samples are written into the deinterleaver RAM in one go. Hence the data is being deinterleaved during the writing process, for example, by the deinterleaver 208 of FIG. 2. On a read, the data is serially read per section, for example, by the decoder 212 of FIG. 2. In exemplary embodiments, during a read, row 0 is read from columns 0 to 29 based on the input width required by the decoder; then row 1 is read from columns 0 to 29 & so on, i.e., each virtual section of RAM is read serially.

When receiving samples, the interleaver uses the modulation type information to save the samples in the interleaver memory within the correct section and write location therein. In this example, the frame being interleaved is a 16-PSK modulated frame and as such includes four streams. The interleaver, for example, the interleaver 220 FIG. 2, recognizes that the RAM is virtually divided into four sections, i.e., one section per each incoming stream, that each section is 30 columns wide, and that the samples are stored by sections. Thus, the interleaver, for example, the interleaver 220 of FIG. 2, receives the samples necessary to populate a section in a row in the following order at each cycle and does a write of the received samples as follows:

Clk1: SD00 to SD29 (Row0 in virtual section 1)
Clk2: SD30 to SD59 (Row1 in virtual section 1)
Clk3: SD60 to SD79 (Row2 in virtual section 1)
etc.

FIG. 5 illustrates a de-interleaving operation for a 32-PSK modulated frame where the RAM is divided into 540-rows×120-columns, according to various embodiments.

SDs may be stored into the RAM into the correct deinterleaved location on the communications system 200 of FIG. 2. As the frame being deinterleaved is a 32-PSK modulated frame and as such includes five streams, the RAM is virtually divided into five (5) sections, i.e., one section per each incoming stream. The samples may be received in the following order at each cycle by a deinterleaver, for example, the deinterleaver 208 of FIG. 2; similarly, when servicing a read request the interleaver (for example, the interleaver 220 of FIG. 2) may retrieve samples from the RAM in the same order as the deinterleaver receives them and sends the retrieved samples to the reader:

clk1: SD0, SD12960, SD25920, SD38880, SD51840
clk2: SD1, SD12961, SD25921, SD38881, SD51841
clk3: SD2, SD12962, SD25922, SD38882, SD51842
etc.

In exemplary embodiments, five samples are received in one clock tick, and these received samples are written into the deinterleaver RAM in one go.

When receiving samples, the interleaver uses the modulation type information to save the samples in the interleaver memory within the correct section and write location therein. In this example, the frame being interleaved is a 32-PSK modulated frame and as such includes five streams. The interleaver, for example, the interleaver 220 FIG. 2, recognizes that the RAM is virtually divided into five sections, i.e., one section per each incoming stream, that each section is 24 columns wide, and that the samples are stored by sections. Thus, the interleaver, for example, interleaver 220 of FIG. 2, receives the samples necessary to populate a section in a row in the following order at each cycle and does a write of the received samples as follows:

Clk1: SD00 to SD23 (Row0 in virtual section 1)
Clk2: SD24 to SD47 (Row1 in virtual section 1)
Clk3: SD48 to SD71 (Row2 in virtual section 1)
etc.

Figure 6:
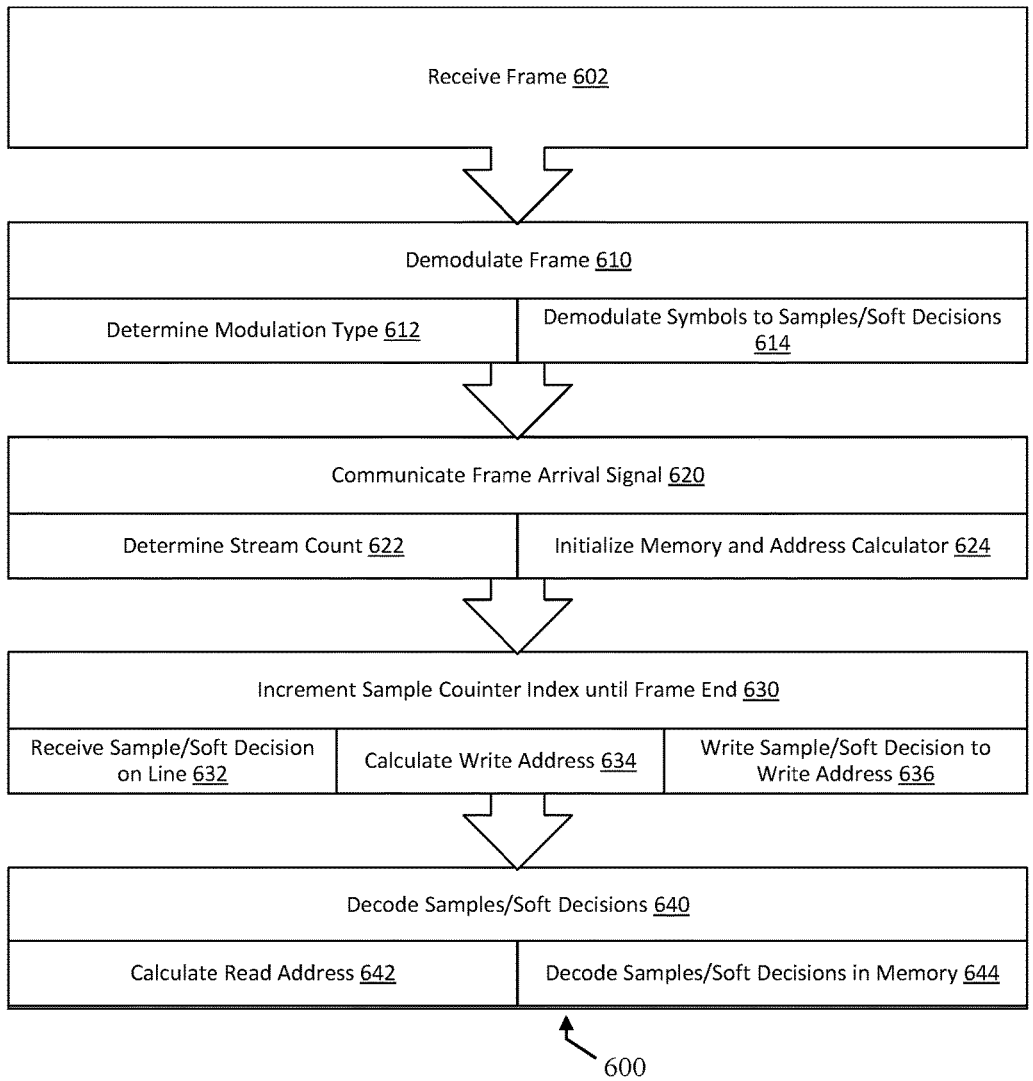
FIG. 6 illustrates a flowchart of an exemplary method for deinterleaving samples according to various embodiments.

FIG. 6 illustrates a flowchart of an exemplary method for deinterleaving samples according to various embodiments.

The present teachings provide a method 600 for deinterleaving samples, for example, at a receiver such as a satellite receiver in a satellite communications system.

In exemplary embodiments, the method 600 includes operation 602 to receive a frame. The method 600 may include operation 610 to demodulate the frame. The method 600 may include operation 612 to determine the modulation type. In some embodiments, operation 612 may determine the stream count by extracting the modulation type from a frame header. The method 600 may include operation 614 to demodulate symbols to samples/soft decisions.

In exemplary embodiments, the method 600 may include operation 620 to communicate a frame arrival signal, for example, to a deinterleaver. The method 600 may include operation 622 to determine a stream count based on the modulation type. The method 600 may include operation 624 to initialize a deinterleaver memory and an address calculator. The method 600 may include operation 630 to increment read a sample counter until frame end. The method 600 may include operation 632 to receive a sample/soft decision from an incoming line. The method may include operation 634 to calculate a write address. The method 600 may include operation 636 to write the sample/soft decision to a write address 636.

The method 600 may include operation 640 to decode the samples/soft decisions. The method may include operation 642 to calculate a read address. The method 600 may include operation 644 to decode soft decisions in the deinterleaver memory.

Figure 7:
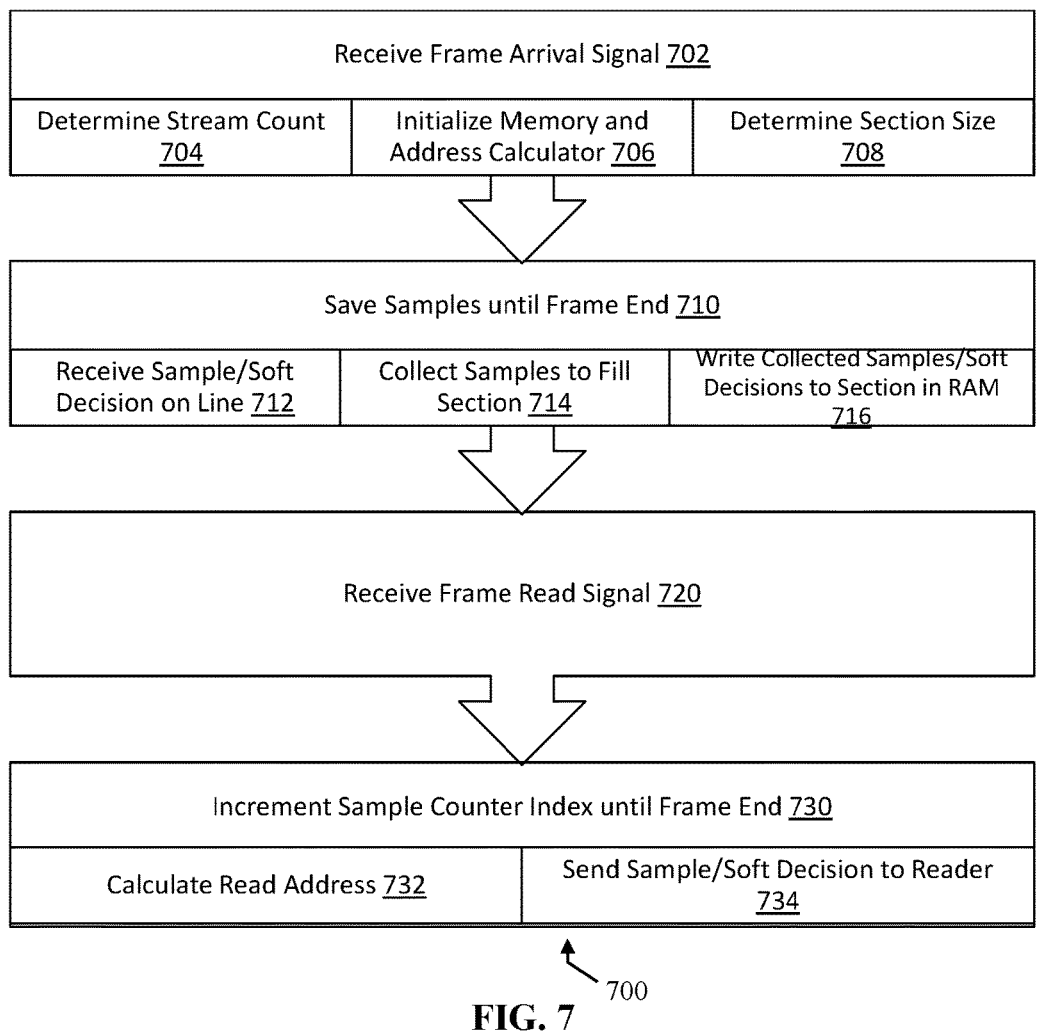
FIG. 7 illustrates a flowchart of an exemplary method for interleaving samples according to various embodiments.

FIG. 7 illustrates a flowchart of an exemplary method for interleaving samples according to various embodiments.

The present teachings provide a method 700 for interleaving samples, for example, at a transmitter such as a satellite transmitter in a satellite communications system.

In exemplary embodiments, the method 700 includes operation 702 to receive a frame arrival signal. The method 700 may include operation 704 to determine a stream count, for example, based on the modulation of the frame. In some embodiments, operation 704 may determine the stream count by extracting the modulation type from a frame header. The method 700 may include operation 706 to initialize a memory and address calculator. In some embodiments, operation 708 may determine a section size by dividing the number of columns by the stream count. The method 700 may include operation 710 to increment a sample counter index until frame end. The method 700 may include operation 712 to receive a sample/soft decision on a line. In some embodiments, the sample/soft decision may be a read from a buffer or RAM. The method 700 may include operation 714 to collect enough samples to fill a section. The method 700 may include operation 716 to write collected samples/soft decisions to the correct section in the RAM.

The method 700 may include operation 720 to receive a frame read signal, for example, from a reader such as a transmitter or a demodulator. The frame read signal may initiate a read of the interleaved data/samples. The method 700 may include operation 730 to increment a sample counter index until frame end. The method 700 may include operation 732 to calculate a read address from an interleaver memory. The method 700 may include operation 734 to send the read sample/soft decision to the reader 734.

Although the subject matter has been described in language specific to structural features and/or methodological acts, it is to be understood that the subject matter in the appended claims is not necessarily limited to the specific features or acts described above. Rather, the specific features and acts described above are disclosed as example forms of implementing the claims. Other configurations of the described embodiments are part of the scope of this disclosure. Further, implementations consistent with the subject matter of this disclosure may have more or fewer acts than as described or may implement acts in a different order than as shown. Accordingly, the appended claims and their legal equivalents should only define the invention, rather than any specific examples given.

We claim as our invention:

1. A method for deinterleaving samples for a frame, the method comprising:
    providing a memory and a stream count selected from n-different supported stream counts;
    virtually dividing the memory into x-rows, y-columns and the y-columns into equal sections, wherein a section count equals the stream count, x is at least a frame length divided by v and y is calculated as a common denominator of a majority of the n-different supported stream counts;
    calculating, for a sample of the samples, a write address comprising a row and stream count number of columns in the row based on a location of the sample in the frame, wherein the sample comprises stream count soft decisions;
    receiving the sample; and
    writing the sample to the memory,
    wherein each soft decision of the sample is written row-wise to a respective column of the row and the memory is less than or equal to the frame length.

2. The method of claim 1, wherein the calculating of the write address, the receiving of the sample, and the writing of the received sample are performed at a rate equal to an incoming sample rate.

3. The method of claim 1, wherein the writing comprises writing the stream count of soft decisions in one clock tick.

4. The method of claim 1, further comprising deinterleaving a frame by reading, from one of the sections of the memory, the sample based on a read index and the stream count.

5. The method of claim 1, wherein the frame length of samples in the frame is variable.

6. The method of claim 1, wherein the stream count is based on a modulation type of the frame and the stream count scales with the modulation type.

7. The method of claim 1, wherein the frame comprises 64,800 samples, each soft decision of the samples is 6-bits, the frame is modulated using a modulation type having eight or fewer streams, the memory is divided into 540-rows and 120-columns, and the 120-columns are subdivided into the sections.

8. A deinterleaver device to deinterleave a frame comprising samples, the device comprising:
    a memory;
    a memory initializer to virtually divide the memory into equal sections, wherein a section count equals a stream count selected from n-different supported stream counts, virtually dividing the memory into x-rows, y-columns and the y-columns into equal sections, a section count equals the stream count, x is at least the frame length divided by y and y is calculated as a common denominator of a majority of the n-different supported stream counts;
    an address calculator to calculate, for a sample of the samples, a write address comprising a row and stream count number of columns in the row based on a location of the sample in the frame, wherein the sample comprises stream count soft decisions; and
    a deinterleaver to receive the sample from the frame, and to write the sample to the memory,
    wherein each soft decision of the sample is written row-wise to a respective column of the row.

9. The deinterleaver device of claim 8, wherein the address calculator calculates the write address, the deinterleaver reads the sample, and the deinterleaver writes the received sample at a rate equal to an incoming sample rate.

10. The deinterleaver device of claim 8, wherein the deinterleaver writes the stream count of received soft decisions in one clock tick.

11. The deinterleaver device of claim 8, further comprising a reader to read, from one of the sections of the memory, the sample based on a read index and the stream count.

12. The deinterleaver device of claim 8, wherein a frame length of samples in the frame is variable.

13. The deinterleaver device of claim 8, wherein the frame comprises 64,800 samples, each soft decision of the samples is 6-bits, the frame is modulated using a modulation type having eight or fewer streams, the memory is divided into 540-rows and 120-columns, and the 120-columns are subdivided into the sections.

14. The deinterleaver device of claim 8, wherein the memory comprises single-port Random Access Memory (RAM) and the memory is less than or equal to the frame length.

* * * * *

UNITED STATES PATENT AND TRADEMARK OFFICE
CERTIFICATE OF CORRECTION

PATENT NO. : 10,484,136 B2
APPLICATION NO. : 15/615358
DATED : November 19, 2019
INVENTOR(S) : Sri Bhat, Bala Subramaniam and Yanlai Liu It is certified that error appears in the above-identified patent and that said Letters Patent is hereby corrected as shown below:

In the Claims

Column 9, Line 45, cancel the text beginning with "1. A method for" to and ending "less than or equal to the frame length." in Column 9, Line 64, and insert the following claim:
--1. A method for deinterleaving samples for a frame, the method comprising:
providing a memory and a stream count selected from n-different supported stream counts;
virtually dividing the memory into x-rows, y-columns and the y-columns into equal sections, wherein
 a section count equals the stream count, x is at least a frame length divided by y and y is
 calculated as a common denominator of a majority of the n-different supported stream counts;
calculating, for a sample of the samples, a write address comprising a row and stream count number
 of columns in the row based on a location of the sample in the frame, wherein the sample
 comprises stream count soft decisions;
receiving the sample; and
writing the sample to the memory,
wherein each soft decision of the sample is written row-wise to a respective column of the row and
 the memory is less than or equal to the frame length.--

Signed and Sealed this
Fourteenth Day of January, 2020

Andrei Iancu
*Director of the United States Patent and Trademark Office*